Jan. 10, 1967 A. UHLIR, JR., ET AL 3,297,922

SEMICONDUCTOR POINT CONTACT DEVICES

Filed Nov. 2, 1961

INVENTOR.
ARTHUR UHLIR, JR.
JOHN V. JENKINSON
BY [signature]
ATTORNEY

United States Patent Office 3,297,922
Patented Jan. 10, 1967

3,297,922

SEMICONDUCTOR POINT CONTACT DEVICES

Arthur Uhlir, Jr., Weston, and John V. Jenkinson, Lexington, Mass., assignors to Microwave Associates, Inc., Burlington, Mass., a corporation of Massachusetts Filed Nov. 2, 1961, Ser. No. 149,583
7 Claims. (Cl. 317—236)

Figure 1:
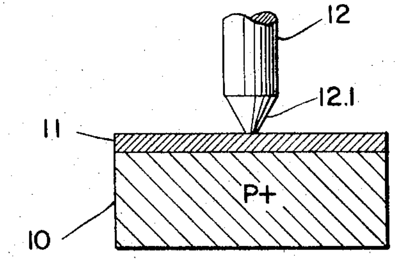

This invention relates to point contact type semiconductor devices, both diodes and transistors, and more particularly to such devices in which an epitaxially-deposited layer on the base material provides the contact surface for one or more point contact electrodes. The invention relates also to point contact type semiconductor devices of the voltage variable capacitance type (i.e., varactors), and more particularly to such devices in which the junction defining the voltage variable capacitance is contained in a high-resistivity layer of semiconductor material on a base or substrate of lower resistivity semiconductor material.

During World War II, it was discovered in England that improved performance of microwave detectors realized in point contact type silicon diodes could be achieved by heat-treating P-type silicon in the presence of air before the catwhisker was contacted to the silicon. This practice was universally adopted. Originally, the only available silicon was very impure. Gradually, the significant impurities for making P-type silicon were identified. Those of primary interest at the present time are boron and aluminum.

As transistor technology demanded better purity and crystal perfection, metallurgists learned to grow single crystals with comparative ease, except in the dopings used for microwave diodes. The resistivity currently used for silicon microwave crystals is approximately 0.01 ohm-cm. P-type silicon. While the art has not succeeded in making single crystal aluminum-doped silicon of this low resistivity, it is possible to make single-crystal boron-doped silicon having a resistivity of 0.01 ohm-cm., and even resistivities far lower than this value. However, processing of point contact diodes from aluminum-doped silicon, using the aforementioned heat treatment step, has yielded microwave mixer crystals which consistently achieve a better combination of burnout and sensitivity properties than similar crystals processed from boron-doped silicon.

One theory, which may be useful to explain the superior burnout and sensitivity properties of aluminum-doped silicon devices over those of boron-doped silicon devices, adopts the assumption that a high resistivity layer at the surface of the crystal is desirable for an improved RC product as described below, and that aluminum doping works better than boron doping in the production of such a layer by the out-diffusion process for the following reasons. Aluminum is chemically very reactive. On the basis of free energy of reaction, aluminum will react with oxygen preferentially over silicon, and is preferentially oxidized compared to silicon. Therefore, there is a strong tendency for aluminum dopant at the surface to be converted to an oxide and consequently to be removed from the immediate surface of the silicon crystal. This provides a boundary condition of low aluminum concentration for a process of out-diffusion. Boron, on the other hand is not preferentially oxidized compared to silicon, at least not nearly as well as aluminum. Boron and silicon will oxidize at approximately the same rate under a given set of conditions, so that the out-diffusion of boron cannot be achieved as readily as that of aluminum.

Referring now to varactors, to which the invention also relates, as the frequencies involved in varactor uses increase, the optimum capacitance of the varactor decreases approximately by a proportional amount. This conclusion follows from impedance considerations alone. When it is sought to use varactors in high frequency parametric amplifiers, there is another reason, in addition to that flowing from impedance considerations, why it is important to provide low capacitance. Parametric amplifiers require pump power at a frequency which is generally several times higher than the signal frequency. It is expensive and difficult to generate large quantities of high frequency power, which must be in the millimeter wave range for parametric amplification of some of the higher commonly used microwave frequencies. The pump power required, other things being equal, is directly proportional to the capacitance of the varactor; it is also proportional to the square of the required pump voltage. To obtain the lowest series resistance and good performance with a low pump voltage, it is necessary to use a relatively low resistivity semiconductor material in the varactor, which in general leads to a high capacitance per unit junction area. These considerations, particularly the desirability of reducing the pump voltage required to achieve parametric amplification, all lead to the use of an extremely small junction area to provide very low capacitance in a given varactor.

A time-honored and convenient means of making semiconductor diodes with very small areas is a point contact, in which a pointed electrode, sometimes called a "catwhisker," is brought into contact with a surface of a body of semiconductor material. In mixer diodes, the point-contact is used to produce a metal-to-semiconductor contact of small area. For the production of junction devices using a point-contact electrode, it is usually advantageous to have a thin coating of a specially chosen impurity on the tip of the point. If such a coated point is brought into contact with the semiconductor and suitably heated, as in an oven or by electrical pulsing, for example, a doped region can be produced which leads to a PN junction if the starting material and the coating material are chosen to give opposite conductivity types.

It has been customary to use indium- or indium-gallium-plated catwhiskers with N-type germanium, and aluminum-coated catwhiskers with N-type silicon, to produce such small area junction diodes. Since gallium can be more easily plated than aluminum, attempts have been made successfully to fabricate a point-contact varactor by electrical pulsing of a gallium-plated whisker on N-type silicon. There exist also gallium arsenide point-contact varactors, made by electrical pulsing of an uncoated catwhisker in contact with N-type gallium arsenide.

The use of uniform resistivity semiconductor material in point-contact devices leads to exceedingly small and fragile contact areas as the useful range is extended to higher frequencies, for the following reasons. The capacitance of the contact is, of course, proportional to its area. The series resistance, on the other hand, involves a quasi-hemispherical geometry and is inversely proportional to the contact diameter. Thus, the RC product, which determines the cutoff frequency, improves as the contact diameter is reduced, for the capacitance decreases more rapidly than the resistance increases. As a consequence, attempts to extend to higher frequencies the useful range of varactors, mixers and detector diodes through the use of small-diameter point contacts eventually lead to devices which are too fragile to be suited to any practical application.

It is a general object of the invention to provide improved point-contact type semiconductor devices.

Another object of the invention is to provide such improved devices in which an epitaxially-deposited layer on the base material provides the contact surface for one or more point-contact electrodes.

An important specific object of the invention is to provide microwave mixer crystal diodes in the form of silicon diodes which will combine in one device the low resistivity and single-crystal uniformity of boron-doped silicon and the superior burnout and sensitivity of devices made of aluminum-doped silicon.

Another specific object of the present invention is to provide silicon diodes employing a substrate of low-resistivity boron-doped silicon having a surface layer of relatively higher-resistivity silicon as the contact surface for one or more point-contact electrodes.

It is another specific object of this invention to provide varactors having a superior combination low capacitance and higher cutoff frequency to any that has heretofore been achieved in a practical device. In this connection additional objects of the invention are to provide such varactors which can be manufactured with available techniques, and to provide such varactors having a junction geometry in which the essential variations in impurity concentration occur along one direction in space, namely, in a direction parallel to the axis of the catwhisker; that is, substantially perpendicular to the plane of the surface of the semiconductor body to which the catwhisker is brought in contact. A further object of the invention is to provide such a varactor which can be housed in packages used to house prior varactors, including housings of the most advanced design, such as ultraminiature housings, for example.

According to the invention, as realized in one embodiment thereof, the lowest presently-available resistivity boron-doped silicon, 0.0006 ohm-cm. P-type, is specified for the substrate. A layer of relatively higher-resistivity silicon is epitaxially deposited on this substrate to a thickness which in most cases is as low as approximately ½ to 2 microns. The thinness of such a thin epitaxial layer distinguishes it from epitaxial material heretofore provided for transistors and other semiconductor devices. A catwhisker, for example, of tungsten 0.5 to 10 mils in diameter which has been pointed by electrolytic etching or mechanical grinding, is brought into contact with the epitaxial layer. This may be accomplished in any suitable package, such as the known coaxial ceramic package or a known type of glass package. Known process and assembly techniques, such as rinsing the silicon die in hydrofluoric acid just prior to making the point contact, to remove the thin layer of oxide which consistently forms on silicon in air, employing a twisting motion in making the contact between the whisker and the die, to vary the characteristics and permit improvement of the contact, and tapping the device after contacting, have been employed with success in fabricating devices according to the invention. However, it should be understood that plated and doped point-contact electrodes, and welded or bonded point-contact electrodes, may also be used with epitaxial material according to the invention, and are included within its scope.

According to the invention, as realized in another embodiment thereof, a substrate body of suitably doped semiconductor material such as N+ germanium doped with arsenic, antimony or phosphorous, and having a resistivity of 0.001 ohm-cm. or lower, is provided with an epitaxially-deposited comparatively thin layer of semiconductor material having a resistivity of at least 0.01 ohm-cm., and a catwhisker, suitably plated at its point, as with indium, to achieve doping of the layer which will provide a desired PN junction therein, is brought in contact with the layer, and then, by any suitable process, such as heating in an oven or electrical pulsing, a doped region is produced in the layer which leads to the desired PN junction in the layer. The thickness of the layer is controlled to provide the desired resistivity independently of the diameter of the point-contact, thereby overcoming the limitation on upper cutoff frequency limit heretofore existing in prior art point-contact varactors. The resistivity of the substrate body can thus be chosen to be desirably small, and the junction capacitance can also be made small without leading to a device having impractical fragility.

Thin epitaxial layers (e.g., 0.5 to 2.0 microns thick) according to the invention have been produced by methods which are essentially similar to the methods used in making a thicker layer, but the time of deposition is reduced, to approximately 2 minutes, for example. Because of the relatively longer times required for heating and cooling the substrate die prior to and following epitaxial deposition, control of the actual time interval during which epitaxial deposition takes place presents special problems, and variations occur from one run to the next. However, it has been found that devices made according to the invention are so far superior to prior devices, such as microwave mixers for example, that their superiority persists in spite of such variations. In employing epitaxial deposition of silicon by the method of growth from the vapor phase by chemical reaction, in which silicon tetrachloride vapors are carried by hydrogen gas over boron-doped silicon dies heated to a temperature of approximately 1150° C., it has been found advantageous to maintain the silicon tetrachloride at about −50° C., to obtain a lower vapor pressure than that which is commonly used for thicker epitaxial layers.

Figure 2:
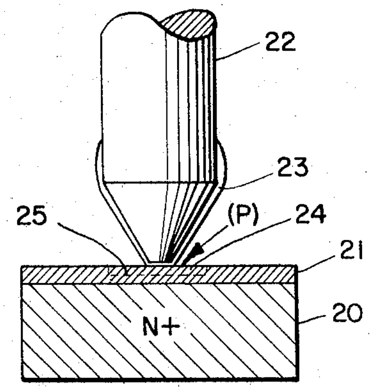

Other and further objects and features of the invention will become apparent from the following description of certain embodiments thereof. This description refers to the accompanying drawings, wherein:

FIG. 1 illustrates schematically the essential elements of a semiconductor diode according to the invention; and FIG. 2 illustrates schematically the essential elements of a varactor according to the invention.

In FIG. 1, a silicon die 10 of boron-doped P+ silicon having a resistivity of 0.0006 ohm-cm. P-type provides a substrate for a layer 11 of epitaxially deposited silicon approximately 0.5 to 1.5 microns thick. A catwhisker 12 of tungsten, which may have any suitable diameter, for example, approximately ½ to 10 mils, the end 12.1 of which may be pointed by electrolytic etching or mechanical grinding, has its pointed end 12.1 in contact with the epitaxial layer 11. The parts shown in FIG. 1 may be held together and enclosed by any known diode housing. The latter are all well-known, and therefore none is described. As is mentioned above, techniques and methods which are known in the art of semiconductor diode fabrication are useful to make diodes of the present invention.

Diodes according to the invention as exemplified by FIG. 1 achieve rectification in the same manner as prior semiconductor rectifier devices of silicon, or germanium or the like. The diodes of the invention provide improvement over the prior art devices, however, in that diodes of the present invention achieve reduced series resistance, or reduced shunt capacitance, or both, compared with the prior devices, and thus have superior high frequency characteristics. The use of high resistivity material (layer 11) at the surface of the die 10 endows the contact region with low capacitance per unit area. This effect depends on only a very thin layer 11. Because the high resistivity layer 11 may be so thin (of the order of 1 micron), the reduced capacitance is obtained with only a slight increase in the series resistance of the entire diode device. The total series resistance is then essentially determined by the resistivity of the bulk material of the substrate or die 10. The latter has a resistivity, in the present example, of only 0.0006 ohm-cm. P-type silicon. This is made possible by the epitaxial deposition of the layer 11 according to the present invention. Hence, the epitaxial material of the invention provides a superior high frequency diode because with it substrate material having a resistivity of 0.001 ohm-cm. or lower can be used, producing a much lower series resistance than has heretofore been possible with the 0.01 ohm-cm. aluminum-doped silicon which had heretofore been required to take advantage of the oxidation heat treatment process to produce a high resistivity surface layer of acceptable characteristics for diodes.

Another advantage of diodes according to the present invention over diodes made by the prior process of outdiffusion of aluminum, or of boron, is that the diodes of the present invention achieve a more precisely controlled high-resistivity layer 11, notwithstanding the above-mentioned care required to achieve an epitaxial layer of the order of 1 micron thick. The reason for this is that a layer achieved by the diffusion process is, after all, diffuse. Hence, in a diffusion layer, there is no one definite resistivity, but rather a gradation from the highest resistivity from the outermost surface region to an asymptotic approach to the resistivity of the bulk material. It is conventional, in the diffusion process, to define a diffusion depth as the depth at which a given percent of the change occurs. For the heat treatment of about 1 hour at 1000° C. (for doped silicon), diffusion depth is about 1 micron. By contrast, an epitaxial layer of far more uniform resistivity, having thickness of the order of 1 micron, can be achieved according to the present invention at roughly the same temperature in about 2 minutes of deposition time, and diffusion at the boundary between the epitaxial layer 11 and the substrate 10 is greatly reduced.

A further advantage of the epitaxial devices of the present invention is that the substrate 10 and the layer 11 may each have a single crystal character. It is usually found for single crystal material that the device results, whatever they are (good or bad), are extremely uniform compared to the results achieved with polycrystalline material. Thus, a higher yield and consequent economy of production are afforded together with superior electrical characteristics.

Microwave mixer diodes have been fabricated according to FIG. 1 having an epitaxial layer approximately 1.5 microns thick, and were found typically to have a conversion loss less than 4 db, while retaining the superior burnout capabilities of the present state of the art. For example, such a mixer diode was tested with an input signal of 9375 mc./sec. and, using a local oscillator signal 30 mc./sec. in frequency below the input signal frequency, a difference signal (30 mc./sec.) was obtained which was not more than 4 db below the input signal in intensity.

It is to be noted that FIG. 1 is not drawn to scale, but is out-of-scale for purposes of illustration. Thus, the catwhisker 12 may have a diameter of ½ to 10 mils, for example, which is about $12\times10^{-4}$ to $254\times10^{-4}$ cm. This is about 12 to 254 times as great as the thickness of a 1 micron thick epitaxial layer 11.

The epitaxial layer 11 can be purse silicon, or P-type or N-type silicon. As the silicon layer is deposited, even in the short time interval of 2 minutes, it can be doped somewhat by boron diffusion out from the substrate. Further, one can introduce a dopant (e.g., phosphorous) into the gas (hydrogen) carrying the silicon tetrachloride, to provide a layer of N-type silicon on a P+ substrate of boron-doped silicon. The epitaxial layer should have a resistivity which is substantially, at least ten times, higher than that of the substrate; in the case of a P+ substrate of boron-doped silicon, this essentially excludes N+ type silicon for the layer 11, but includes layers of pure silicon, N-type silicon, and P-type silicon.

Referring to FIG. 2, which illustrates a PN junction diode according to the invention, a substrate body 20 of semiconductor material has an epitaxially-deposited layer 21 of semiconductor material on one surface thereof. A catwhisker 22, suitably plated at its point with a dopant 23 for the layer 21, is in contact at its pointed end with the layer 21. By a small-area alloying technique, to be hereinafter described, the dopant 23 achieves a doped P-type region 24 having a somewhat flattened circular junction 25 with the layer 21. The substrate body 20 may be made of N+ germanium, doped, for example, with arsenic, antimony or phosphorous. Such a material can be made to have a resistivity of 0.001 ohm-cm., and its resistivity may be as low as 0.0006 ohm-cm. The epitaxially-deposited layer 21 is about 1 micron thick, and may range in thickness between 0.5 and 2.0 microns. The junction 25 is entirely within the layer 21. The layer 21 may be made, for example, by a process of growth from the vapor phase by chemical reaction. The dopant 23 may be an indium, or indium-gallium plate on the catwhisker 22. If the substrate body 20 is N-type silicon, an aluminium or gallium dopant 23 may be used.

Varactors according to the invention have been made and used successfully. For example, for the low-voltage, low-capacitance, amplifier-type varactor, good results have been obtained with an epitaxial layer 21 of N-type silicon of approximately 0.6 ohm-cm. resistivity, about 1 micron thick, on a substrate body 20 of heavily-doped N-type silicon of low resistivity, approximately 0.001 ohm-cm. Useful varactor devices, for example, for the generation of harmonic power or the switching of millimeter wave frequencies, can be made with higher voltage breakdown by using higher resistivity material. If one seeks higher resistivity in the epitaxial layer, and is able to sacrifice high frequency capability, the epitaxial layer can be made thicker than 2.0 microns. For example, an epitaxial layer 21 of 1 ohm-cm. resistivity and about 6 microns thickness has been used in connection with the point-contact technique to make 50-volt varactors. For each of these types, an electroplated gallium whisker coating 23 was used as the dopant, and the junction 25 was formed by electrical pulsing by capacitor discharge across the point of the catwhisker 22 and the epitaxial layer 21. A capacitance of 0.1 mf., charged to 7.5 volts, was used.

The junction capacitance of both of the varactor diode types described above may vary from less than 0.1 pf. to approximately 1.0 pf., at zero bias or less. Both types have been built with junction capacitance as low as 0.03 pf. Either of these varactor types is useful as a very fast logic diode for digital computers, having turn-off times below the limit of measurement of 0.6 nanosecond. Each type has been tested for cutoff frequency, and in cases where the layer 21 is not more than about 2.0 microns thick has exhibited cutoff frequency in excess of 130 kilomegacycles per second, and exceeding 200 kmc., in some cases (e.g., layer 21 about 1.0 micron thick). In the case where the layer 21 is about 6 microns thick, the cutoff frequency is about 50 megacycles per second, and the breakdown voltage is about 50 volts.

A varactor as above described, of the low-capacitance amplifier type, has been caused to amplify at a frequency of 8 kmc./sec. with 16 kmc./sec. pump power of only 3 milliwatts, whereas prior art mesa junction varactors ordinarily require 50 milliwatts of pump power in such service, because of larger capacitance.

Since, as FIG. 2 shows, the substrate 20 is N+-type material, and the doped contact region 24 of the layer 21 is P-type material, and recalling from the foregoing discussion that the epitaxial layer 21 may be intrinsic material, it will be appreciated that P-I-N type semiconductor diodes can also be made according to FIG. 2.

Similar improvements are possible with other semiconductor materials, such as gallium arsenide. Because of the relatively higher mobilities in gallium arsenide, the layer 11 may be somewhat thicker than in the case of silicon, of the order of twice as thick, for example. The invention includes within its scope generally any semiconductor device of the point contact type employing a substrate die of a given low resistivity having an epitaxial layer of semiconductor material, the layer having a resistivity at least ten times that of the substrate and a thickness between approximately 0.5 and 2.0 microns (as high as 6.0 microns in some special cases), with one or more point contact electrodes in point contact with the epitaxial layer. As is mentioned above, the term "point-contact electrode" includes within its scope plated and doped point-contact electrodes, and welded or otherwise bonded rectifying point-contact electrodes, as well as point-contact electrodes which are simply in mechanical ohmic or rectifying contact with the epitaxial layer. Furthermore, the term "epitaxial layer" includes within its scope all forms of epitaxial growth, such as vapor deposition directly from the metal being deposited, and growth from the vapor phase by chemical reaction. The term "epitaxy" as used in the claims refers to structures produced by epitaxial growth, namely, oriented intergrowth between two solid phases, the surface of one crystal providing, through its lattice structure, preferred positions for the deposition of the second crystal. This is substantially the definition of "epitaxy" that is found in Van Nostrand's Scientific Encyclopedia, 3rd edition, 1958, page 605. Junctions made by the technique of epitaxial deposition are known in the art as abrupt, in that, structurally, there is a rapid change in conductivity type impurity from one side of the junction to the other. As is mentioned above, this physical property of an epitaxial, or epitaxy, layer, which distinguishes it from a diffuse layer, is used to advantage in the present invention. This property, realized in an epitaxy layer not thicker than about 6.0 microns, has enabled the achievement of superior microwave performance characteristics as represented in the foregoing examples.

The embodiments of the invention which have been illustrated and described herein are but a few illustrations of the invention. Other embodiments and modifications will occur to those skilled in the art. No attempt has been made to illustrate all possible embodiments of the invention, but rather only to illustrate its principles and the best manner presently known to practice it. Therefore, while certain specific embodiments have been described as illustrative of the invention, such other forms as would occur to one skilled in this art on a reading of the foregoing specification are also within the spirit and scope of the invention, and it is intended that this invention includes all modifications and equivalents which fall within the scope of the appended claims.

What is claimed is:

1. A point-contact type of semiconductor device comprising a body of doped extrinsic semiconductor material, a point-contact type of electrode, and a layer of epitaxy semiconductor material on said body, said layer having a resistivity which is at least ten times higher than the resistivity of said body and a thickness not greater than about 6.0 microns, said electrode being in point-contact with said layer.

2. A point-contact type semiconductor device comprising a body of doped extrinsic semiconductor material, a point-contact type of electrode, a layer of epitaxy semiconductor material on said body, said layer having a resistivity which is at least ten times higher than the resistivity of said body and a thickness not greater than about 6.0 microns, said electrode being in point-contact with said layer, and a region of doped semiconductor material in said layer surrounding said point-contact, the boundary between said region and the remainder of said layer constituting a semiconductor p-n junction.

3. A point-contact type of semiconductor device comprising a body of semiconductor material, a point-contact type of electrode, and a layer of epitaxy semiconductor material on said body and forming a substantially abrupt junction therewith, said layer having a bulk resistivity which is greater than the bulk resistivity of said body and a thickness not greater than about 6.0 microns, said electrode being in point-contact with said layer.

4. A point-contact type semiconductor device comprising a body of semiconductor material doped with an impurity, an epitaxy layer of said material on said body and forming a substantially abrupt junction therewith, the bulk resistivity of said layer being greater than the bulk resistivity of said body, said layer having a thickness not greater than about 6.0 microns, and a point-contact type of electrode in point-contact with said layer.

5. A point-contact type semiconductor device comprising a body of doped extrinsic semiconductor material, a point-contact type of electrode, and an epitaxially-deposited layer of semiconductor material on said body and forming a substantially abrupt junction therewith, said layer having a thickness between approximately 0.5 and 2.0 microns and a bulk resistivity which is greater than the bulk resistivity of said body, said electrode being in point-contact with said layer.

6. A semiconductor device as defined in claim 5 wherein said body is P+ type silicon and said layer is substantially intrinsic semiconductor silicon.

7. A semiconductor device as defined in claim 5 wherein said body is N+ silicon and said layer is substantially intrinsic semiconductor silicon.

References Cited by the Examiner

UNITED STATES PATENTS

| | | | |
|---|---|---|---|
| 2,161,600 | 6/1939 | Geel | 317—236 X |
| 2,161,601 | 6/1939 | Geel | 317—236 X |
| 2,524,035 | 10/1950 | Bardeen et al. | 317—236 X |
| 2,697,269 | 12/1954 | Fuller | 3177—235 X |
| 2,824,269 | 2/1958 | Ohl | 317—236 |
| 2,894,184 | 7/1959 | Veach et al. | 317—236 |
| 2,952,824 | 9/1960 | Paarson | 317—240 |
| 3,028,529 | 4/1962 | Belmont et al. | 317—234 |
| 3,040,218 | 6/1962 | Byczkowski | 317—234 |
| 3,089,794 | 5/1963 | Marinace | 418—1.5 |
| 3,121,808 | 2/1964 | Kahng et al. | 317—234 |
| 3,131,098 | 4/1964 | Krsek et al. | |

OTHER REFERENCES

Article entitled "Graded Concentration Semiconductor," by R. L. Anderson, J. C. Marinace and M. J. O'Rourke found in the IBM Technical Disclosure Bulletin, vol. 3, No. 4, September 1960, at page 32.

JOHN W. HUCKERT, *Primary Examiner.*

GEORGE N. WESTBY, *Examiner.*

E. PUGH, J. D. KALLAM, A. M. LESNIAK, *Assistant Examiners.*